United States Patent [19]

Kamiya et al.

[11] Patent Number: 4,739,264
[45] Date of Patent: Apr. 19, 1988

[54] MAGNETIC SENSOR USING A PLURALITY OF HALL EFFECT DEVICES

[75] Inventors: Masaaki Kamiya; Masayuki Namiki, both of Tokyo, Japan

[73] Assignee: Seiko Instruments & Electronics Ltd., Tokyo, Japan

[21] Appl. No.: 829,448

[22] Filed: Feb. 13, 1986

[30] Foreign Application Priority Data

Feb. 25, 1985 [JP] Japan .................................. 60-35979

[51] Int. Cl.$^4$ ...................... G01R 33/06; H01L 43/06; H03K 17/90
[52] U.S. Cl. ..................................... 324/251; 307/309
[58] Field of Search ............... 324/207, 208, 235, 251, 324/117 H; 307/309; 338/32 H; 73/DIG. 3; 323/294, 368; 330/6; 310/DIG. 3

[56] References Cited

U.S. PATENT DOCUMENTS

| | | | |
|---|---|---|---|
| 3,419,798 | 12/1968 | Walton | 324/251 |
| 4,349,814 | 9/1982 | Akehurst | 324/251 X |
| 4,464,629 | 8/1984 | Tanaka et al. | 307/309 X |
| 4,465,976 | 8/1984 | Avery et al. | 338/32 H X |

FOREIGN PATENT DOCUMENTS

| | | | |
|---|---|---|---|
| 0143085 | 11/1979 | Japan | 338/32 H |
| 0107087 | 7/1982 | Japan | 338/32 H |
| 0002085 | 1/1983 | Japan | 338/32 H |
| 0130215 | 7/1985 | Japan | 324/251 |

Primary Examiner—Gerard R. Strecker
Attorney, Agent, or Firm—Bruce L. Adams; Van C. Wilks

[57] ABSTRACT

Two Hall effect devices are series-connected to form a magnetic sensor. Each of the Hall effect devices has a pair of Hall terminals for developing a Hall voltage when exposed to an external magnetic field. A comparator compares the potentials of two selected Hall terminals of the different Hall devices with each other to produce a compared signal. A switching element is connected to one of the Hall devices to control the potential of the Hall terminals to equalize the potentials of the two selected Hall terminals in response to the compared signal. Two non-selected Hall terminals develop positive and negative Hall voltages, respectively, relative to the selected Hall terminals so that the magnetic sensor produces a totalized Hall voltage of the two Hall effect devices.

16 Claims, 3 Drawing Sheets

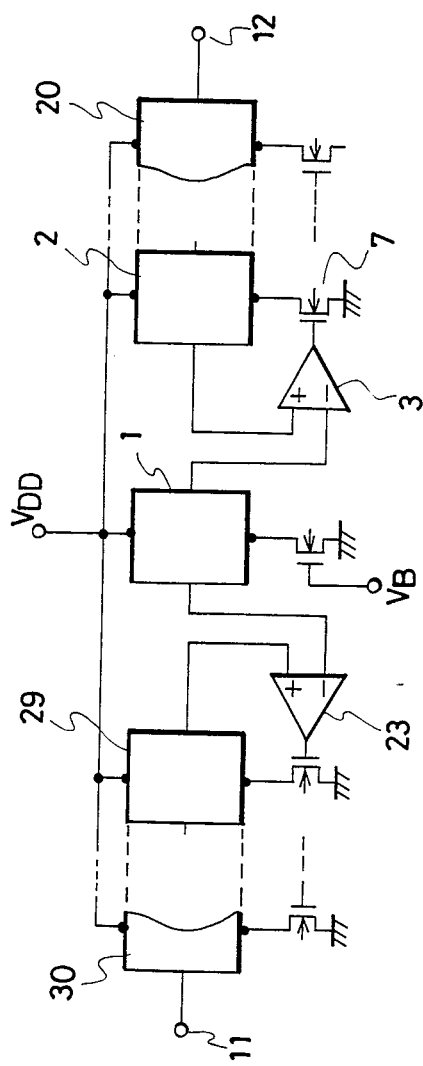

MAGNETIC SENSOR USING A PLURALITY OF HALL EFFECT DEVICES

BACKGROUND OF THE INVENTION

The present invention relates to a magnetic sensor for use in brushless direct current motors and position detecting devices.

The demand for a highly sensitive magnetic sensor is rising in order to keep in time with the development of miniatuarization and low pressure operation of brushless direct current motors and of position detecting devices.

Conventionally, in order to make a highly sensitive magnetic sensor, Hall effect devices made of semi conductor material such as gallium arsenic or indium phosphorous and the like which have high mobility characteristics have been utilized for highly sensitive magnetic sensors.

By utilizing semi conductor materials which have high mobility characteristics, there is a limit in improving the magnetic sensitivity. Also, when integrating comparators and other logic circuits in addition to the Hall effect device onto one chip, silicon is the most utilizable material as the material for magnetic sensors. However, the Hall effect device made of silicon has a defect that its magnetic sensitivity is low.

SUMMARY OF THE INVENTION

It is an object of the present invention to obtain a highly sensitive magnetic sensor by utilizing material such as silicon that has low mobility characteristics.

This object have been attained by using a plurality of Hall effect devices as magnetic sensors, and by adding up the Hall voltages generated by each of the Hall effect devices.

BRIEF DESCRIPTION OF THE DRAWINGS

FIG. 4 is a structural diagram showing an embodiment of a magnetic sensor which is made highly sensitive by utilizing more than three Hall effect devices.

DETAILED DESCRIPTON OF PREFERRED EMBODIMENTS

Figure 1:
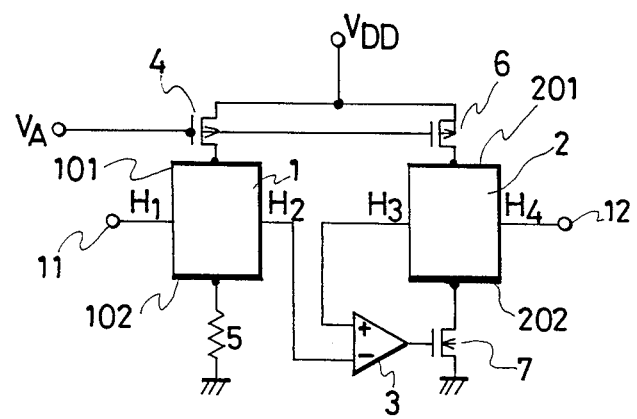
FIG. 1 is a structural diagram of the highly sensitive magnetic sensor of the present invention.

The explanation of the present invention referring to the drawings is as follows.

FIG. 1 shows an embodiment of a magnetic sensor in which Hall voltages of Hall effect devices 1 and 2 having identical characteristic are added up. P-channel transistors 4 and 6 are connected between an electric current supply line (a potential of which is represented by $V_{DD}$) and respective ones of the Hall effect devices 1 and 2. A voltage VA is applied to respective gates of the P-channel transistors 4 and 6 to supply a fixed electric current to both of the Hall effect devices 1 and 2. In order to compare the voltage or potential of a Hall terminal H2 of Hall effect device 1 with the voltage or potential of a Hall terminal H3 of Hall effect device 2, a comparator 3 is connected at input terminals thereof to the Hall terminals H2 and H3 and supplies a control signal representative of the voltage difference between the Hall terminals H2 and H3 to a gate of a variable resistance element in the form of an n-channel transistor 7 connected between the ground and a current drive terminal 202 of the Hall effect device 2 so that the voltage of Hall terminal H2 and the voltage of Hall terminal H3 become equal. As the potential of the current drive terminal 202 relative to the ground, i.e., the source-to-drain voltage of the n-channel transistor 7 is controlled by the control signal of the comparator 3 applied to the gate of the transistor 7, the potential of current drive terminals 201 and 202 of the Hall effect device 2 both shift in parallel to each other by the above voltage variation of the transistor 7, because the potential difference between the current drive terminals 201 and 202 is kept constant due to the fixed electric current flowing therebetween. Accordingly, the potential of the Hall terminal H3 is also shifted by the application of the output signal of the comparator 3 to the gate of the transistor 7.

As a result, the voltage or potential of Hall terminal H3 is controlled to be equal to the voltage or potential of Hall terminal H2 because the comparator 3 operates to control the transistor 7 so as to null the potential difference between the Hall termianls H2 and H3. A resistor 5 is connected between an electric current drive electrode 102 of the Hall effect device 1 and the ground to keep the voltage of electric current drive electrode 102 of Hall effect device 1 a little higher than the ground voltage. When the voltage of Hall terminal H2 is lower than that of Hall terminal H3, this resistor 5 makes it possible to equalize the voltage of both terminals. Thus resistor 5 can be omitted if the distance from the electric current drive electrode 101 to the Hall terminals H1 and H2 of Hall effect device 1 is shorter than the distance from the electrode 201 to the terminals H3 and H4 of Hall effect device 2.

Figure 2:
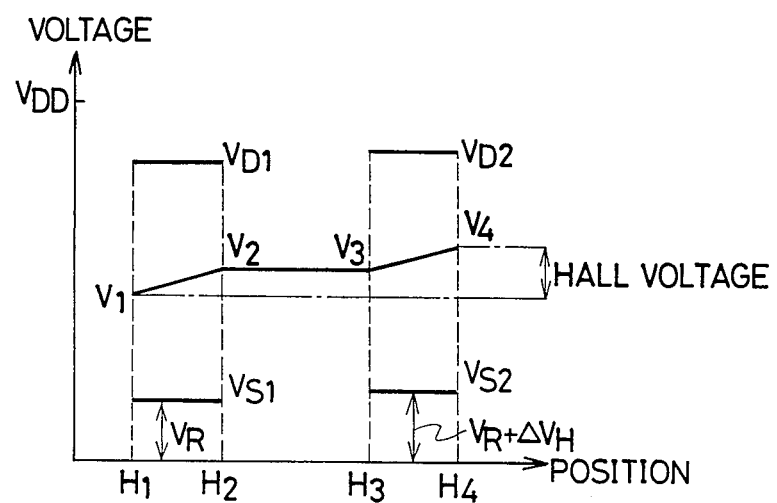
FIG. 2 is a diagram to explain the operation of the magnetic sensor shown in FIG. 1.

FIG. 2 shows the operation of the magnetic sensor shown in FIG. 1, when the magnetic sensor is exposed to an external magnetic field. When the Hall output voltage of Hall effect device 1 develops across the Hall terminals H1 and H2 due to Hall effect caused by the magnetic field, the circuit composed of parts such as the comparator 3 and the transistor 7 shown in FIG. 1 operates to keep voltage $V_2$ of Hall terminal H2 to be equal to voltage $V_3$ of Hall terminal H3.

Here, voltages $V_{D2}$ and $V_{S2}$ of the current drive terminals 201 and 202 of the Hall effect device 2 are shifted higher than voltages $V_{D1}$ and $V_{S1}$ of the current drive terminals 101 and 102 of the Hall effect device 1, by the amount corresponding to the Hall voltage $\Delta V_H$ that is generated in Hall effect device 1.

Therefore, the total Hall voltage $V_H$ generated across output terminals 11 and 12 of the magnetic sensor is determined according to the following relation;

$$V_H = (V_2 - V_1) + (V_4 - V_3) = 2\Delta V_H$$

Thus the total voltage $V_H$ is obtained by the sum of the Hall voltages $\Delta V_H$ of the two Hall effect devices 1 and 2.

Figure 3:
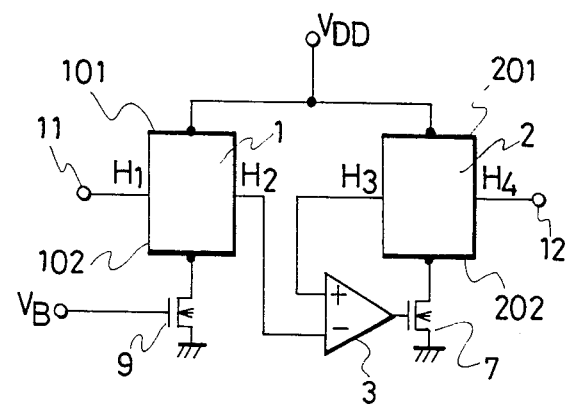
FIG. 3 is a structural diagram showing simplified embodiment of the magnetic sensor

FIG. 3 shows another embodoment of the present invention where the circuit construction shown in FIG. 1 is simplified. To add up the Hall voltage $\Delta V_H$ that generates in each Hall effect device, there will be no need to simultaneously vary the voltage of both of the current drive electrodes 201 and 202 disposed on the Hall effect device 2. In FIG. 3, by shifting only the voltage of the current drive electrode 202 disposed on the Hall effect device 2 without changing the voltage of the current drive electrode 201 which is held at the voltage $V_{DD}$ of the current supply line, the voltage of the Hall terminal H2 becomes equal to the voltage of the Hall terminal H3. In the system operation as above, the Hall voltage generated in each Hall effect device is generally very small as compared with the voltage applied between the current drive electrodes 201 and 202. Therefore, even though the voltage of the current drive electrode 202 varies by the amount of the Hall voltage $\Delta V_H$ produced in the Hall effect device 1 and therefore the voltage between the drive current electrodes 201 and 202 becomes different from the voltage between the drive current electrodes 101 and 102, the magnetic sensitivity of the Hall effect device 2 is substantially equal to the magnetic sensitivity of Hall effect device 1. Stated otherwise, the Hall voltage generated in the Hall device 2 is substantially equal to that generated in the Hall device 1. Therefore in this case, the magnetic sensor generates across the output terminals 11 and 12 thereof about two times larger output voltage than the Hall voltage of a single Hall effect device. In this embodiment, an n-channel transistor 9 to a gate of which voltage of $V_B$ is applied, operates in the same manner as the resistor 5 shown in FIG. 1. As in the case of FIG. 1, by suitably arranging the position of the Hall terminals H1 and H2, the n-channel transistor 9 can be omitted from the magnetic sensor shown in FIG. 3.

FIG. 4 shows an embodiment of a highly sensitive magnetic sensor of the present invention utilizing more than three Hall effect devices. By connecting a plurality of Hall effect devices in series as shown in FIG. 4, the magnetic sensor can obtain higher sensitivity than that of a single Hall effect device, and the total output Hall voltage across the outoput terminals 11 and 12 of the magnetic sensor is obtained by multiplying the Hall voltage $\Delta V_H$ of each Hall effect device by the number of series connected Hall effect devices.

Figure 5:
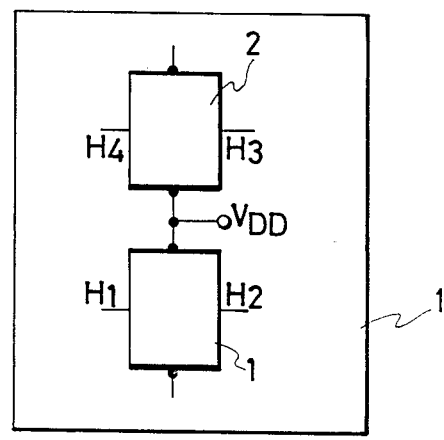
FIG. 5 shows a relative arrangement of the Hall effect devices to cancel the parasitic Hall voltage that developes in the Hall effect devices by mechanical strains.

FIG. 5 shows a magnetic sensor in which two Hall effect devices 1 and 2 are mounted on one semi-conductor substrate so that the Hall effect devices 1 and 2 develop an offset voltage at Hall terminals H1 and H4 relative to the Hall terminal H2 and H3, respectively, due to the Piezo Resistance effect of the semiconductor substrate which is caused by mechanical strain applied thereto.

The Hall effect devices 1 and 2 are connected with each other at the Hall terminals H2 and H3 and the voltages of the Hall terminals H2 and H3 are kept equal on the semi-conductor substrate so that the Hall terminals H1 and H4 have a substantially same potential level shifted equally by the offset voltage relative to the Hall terminals H2 and H3 and therefore the offset voltages generated at the Hall terminals H1 and H4 by the Piezo Resistance effect can be cancelled, because there is no substantial potential difference between the Hall terminals H1 and H4, that is, the output terminals of the magnetic sensor. By cancelling the Piezo Resistance effect, the accuracy of the magnetic sensor is improved.

As explained above, by adding up the Hall voltages generated at a plurality of Hall effect devices, the magnetic sensitivity of the magnetic sensor is easily improved.

The structure of the Hall effect devices in the present embodiments is formed to be similar to each other in order to simplify the explanation, but such structure is not always necessary to achieve the object of the present invention. Also the voltage which is applied to the current drive electrodes of respective Hall effect devices need not be equal.

What we claim is:

1. A magnetic sensor comprising: a first Hall effect device having a first Hall terminal and a second Hall terminal for obtaining a first Hall voltage generated in the first Hall effect device when the magnetic sensor is exposed to an external magnetic field; a second Hall effect device having a third Hall terminal and a fourth Hall terminal for obtaining a second Hall voltage generated in the second Hall effect device when the magnetic sensor is exposed to an external magnetic field; first and second driving electrodes for supplying a voltage to the first Hall effect device; third and fourth driving electrodes for supplying a voltage to the second Hall effect device; a resistance element connected between the second driving electrode and a reference terminal for fixing the potential of the second driving electrode relative to the reference terminal; a variable resistance element having a control terminal and connected between the fourth driving electrode and the reference terminal for controlling the potential of the fourth driving electrode relative to the reference terminal by a switching operation of the variable resistance element; a comparator having a first input terminal connected to the second Hall terminal of the first Hall effect device, a second input terminal connected to the third Hall terminal of the second Hall effect device, and an output terminal for applying a control signal representative of the voltage difference between the second and third Hall terminals to the control terminal of the variable resistance element such that a voltage of the second terminal of the first Hall effect device is shifted nearly equal to a voltage of the third Hall terminal of the second Hall effect device by cooperation of the comparator and the variable resistance element so that a total output voltage of the magnetic sensor is produced between the first Hall terminal of the first Hall effect device and the fourth Hall terminal of the second Hall effect device by adding the first Hall voltage to the second Hall voltage.

2. A magnetic sensor according to claim 1; wherein the variable resistance element comprises a switching MOS transistor having a main electrode connected to the fourth driving electrode and a gate electrode connected to the output terminal of the comparator.

3. A magnetic sensor according to claim 2; wherein the resistance element comprises a MOS transistor having a main electrode connected to the second driving electrode and a gate electrode for receiving a constant voltage.

4. A magnetic sensor comprising: a pair of Hall effect devices for effecting a magneto-electrical conversion, each of the Hall effect devices having a pair of opposed drive electrodes held at different potentials for flowing therebetween a drive current effective to drive the Hall effect device, and a pair of opposed Hall terminals for developing therebetween a Hall voltage when the Hall effect device is exposed to an external magnetic field, the pair of Hall terminals being disposed between the pair of drive electrodes such that the Hall terminals are biased by the pair of drive electrodes at a given potential; detecting means connected between a selected Hall terminal from one of said pairs of opposed Hall terminals and a selected Hall terminal from the other of said pairs of opposed Hall terminals for detecting a potential difference between said two selected Hall terminals to produce at the output of the detecting means a control signal representative of the potential difference; shifting means connected to one of the drive electrodes and having a control terminal connected to the output of the detecting means, said shifting means shifting the potential of said one of the drive electrodes in response to the control signal to effect a potential shift of one of the two Hall terminals biased by that drive electrode to thereby null the potential difference between the two Hall terminals; and output means comprised of the two non-selected Hall terminals for developing positive and negative Hall voltages, respectively, relative to the two selected Hall terminals so that the output means produce a totalized Hall voltage of the pair of Hall effect devices.

5. A magnetic sensor according to claim 4; wherein the detecting means comprises a comparator.

6. A magnetic sensor according to claim 4; wherein the shifting means comprises a MOS transistor.

7. A magnetic sensor according to claim 4; including a power supply line and a ground line for supplying the drive current to the pairs of drive electrodes connected between the power supply line and the ground line.

8. A magnetic sensor according to claim 7; including means connected between the power supply line and the drive electrodes for supplying thereto a fixed drive current.

9. A magnetic sensor according to claim 8; wherein the means for supplying a fixed drive current comprises a pair of MOS transistors.

10. A magnetic sensor according to claim 7; wherein the shifting means is connected between the ground line and a drive electrode of one of the Hall effect devices.

11. A magnetic sensor according to claim 10; including biasing means connected between the ground line and a drive electrode for the other Hall effect device for biasing the same at a given potential.

12. A magnetic sensor according to claim 11; wherein the biasing means comprises a resistor.

13. A magnetic sensor according to claim 11; wherein the biasing means comprises a MOS transistor.

14. A magnetic sensor according to claim 4; including a semiconductor substrate having incorporated thereon the pair of Hall effect devices.

15. A magnetic sensor according to claim 4; wherein the pair of Hall effect devices have the same configuration.

16. A magnetic sensor according to claim 14; wherein the pair of Hall effect devices are arranged relative to each other to cancel offset voltages developed between respective pairs of the Hall terminals.

* * * * *